(12) United States Patent
Leobandung (10) Patent No.: US 8,916,445 B1
(45) Date of Patent: Dec. 23, 2014

(54) SEMICONDUCTOR DEVICES AND METHODS OF MANUFACTURE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/969,017

(22) Filed: Aug. 16, 2013

(51) Int. Cl.
*H01L 21/331* (2006.01)
*H01L 21/762* (2006.01)
*H01L 21/02* (2006.01)

(52) U.S. Cl.
CPC .... *H01L 21/02647* (2013.01); *H01L 21/76224* (2013.01)
USPC .............. 438/341; 257/E21.09; 257/E21.097; 257/E21.108; 257/E21.566; 438/222; 438/245; 438/269; 438/357; 438/481

(58) Field of Classification Search
USPC ...................... 257/E21.09, E21.097, E21.108, 257/E21.566; 438/222, 245, 269, 341, 357, 438/481
See application file for complete search history.

(56) References Cited

U.S. PATENT DOCUMENTS

| 8,253,211 | B2 | 8/2012 | Cheng et al. | |
|---|---|---|---|---|
| 8,274,097 | B2 | 9/2012 | Cheng | |
| 8,309,986 | B2 | 11/2012 | Lochtefeld | |
| 8,384,196 | B2 | 2/2013 | Cheng et al. | |
| 2005/0277260 | A1* | 12/2005 | Cohen et al. .................. | 438/387 |
| 2007/0015346 | A1* | 1/2007 | Cohen et al. .................. | 438/481 |
| 2009/0091002 | A1* | 4/2009 | Arena et al. .................. | 257/623 |
| 2010/0041214 | A1* | 2/2010 | Cho et al. ...................... | 438/481 |
| 2012/0068226 | A1 | 3/2012 | Hydrick et al. | |
| 2012/0315744 | A1 | 12/2012 | Cheng | |
| 2013/0034924 | A1 | 2/2013 | Lochtefeld | |
| 2013/0040431 | A1 | 2/2013 | Ye et al. | |
| 2013/0043506 | A1 | 2/2013 | Tsai et al. | |
| 2013/0099282 | A1 | 4/2013 | Chen et al. | |

FOREIGN PATENT DOCUMENTS

EP    2528087 A3    3/2013

\* cited by examiner

*Primary Examiner* — Asok K Sarkar
(74) *Attorney, Agent, or Firm* — Lou Percello; Roberts Mlotkowski Safran & Cole, P.C.

(57) ABSTRACT

Semiconductor devices with reduced substrate defects and methods of manufacture are disclosed. The method includes forming a dielectric material on a substrate. The method further includes forming a shallow trench structure and deep trench structure within the dielectric material. The method further includes forming a material within the shallow trench structure and deep trench structure. The method further includes forming active areas of the material separated by shallow trench isolation structures. The shallow trench isolation structures are formed by: removing the material from within the deep trench structure and portions of the shallow trench structure to form trenches; and depositing an insulator material within the trenches.

18 Claims, 7 Drawing Sheets

SEMICONDUCTOR DEVICES AND METHODS OF MANUFACTURE

FIELD OF THE INVENTION

The invention relates to semiconductor structures and, more particularly, to semiconductor devices with reduced substrate defects and methods of manufacture.

BACKGROUND

Semiconductor manufacturing consists of a complex set of processes. These processes include three main building blocks: (i) deposition of thin films of material on a substrate, (ii) applying a patterned mask on top of the films by photolithographic imaging, and (iii) etching the films selectively to the mask. These three main building blocks must be rigorously calibrated and monitored to minimize defects.

The manufacture of semiconductor devices can vary depending on the devices or structures being manufactured. Some of these manufacturing processes have inherent issues, which can lead to defects in the underlying substrate. For example, the bonding or growth patterns of certain materials can lead to lattice mismatch issues, resulting in defects to the underlying substrate. More specifically, growing certain materials within confined spaces, e.g., trenches, can result in defects to the underlying substrate, due to a large lattice mismatch with respect to the underlying substrate, e.g., Si. Along with a large lattice mismatch is large threading dislocation densities, which adversely impact device yield. For example, using III-V materials or Ge film grown directly on Si, the threading dislocation density at the surface can be above $10^8/cm^2$, which will considerably negatively impact device yield.

Accordingly, there exists a need in the art to overcome the deficiencies and limitations described hereinabove.

SUMMARY

In a first aspect of the invention, a method comprises forming a dielectric material on a substrate. The method further comprises forming a shallow trench structure and deep trench structure within the dielectric material. The method further comprises forming a material within the shallow trench structure and deep trench structure. The method further comprises forming active areas of the material separated by shallow trench isolation structures. The shallow trench isolation structures are formed by: removing the material from within the deep trench structure and portions of the shallow trench structure to form trenches; and depositing an insulator material within the trenches.

In another aspect of the invention, a method comprises forming a shallow trench structure within a dielectric material. The method further comprises forming at least one deep trench structure within the dielectric material and aligned within the shallow trench structure. The method further comprises forming at least a first material within the shallow trench structure and the deep trench structure. The method further comprises forming active areas of the at least first material, comprising forming shallow trench isolation structures in the at least first material. At least one of the shallow trench isolation structures extend within the deep trench structure after removal of the at least first material.

In yet another aspect of the invention, a structure comprises a shallow trench structure within a dielectric material. The structure further comprises at least one deep trench structure within the dielectric material and aligned within the shallow trench structure. The structure further comprises active areas of at least a first material within the shallow trench structure, separated by shallow trench isolation structures extending within the least one deep trench structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to semiconductor devices and methods of manufacture. In more specific embodiments, the present invention is directed to the manufacture of NFET and PFET devices on a single substrate, while minimizing substrate defects. For example, in embodiments, the present invention utilizes germanium and III-V materials to improve NFET and PFET device performance while, advantageously, mitigating defects, including the formation of threading dislocation densities. In this way, device improvements and yields are considerably increased due to the processes of the present invention.

FIGS. 1-5 show fabrication processes and respective structures in accordance with aspects of the present invention. In particular, the structure 5 of FIG. 1 includes a substrate 10. The substrate 10 can be, for example, a Si wafer; although other semiconductor materials are contemplated by the present invention. In embodiments, the substrate 10 can be, for example, a P—Si wafer. A dielectric layer 12 can be deposited on the substrate 10, with a thickness of about 100 nm; although other dimensions are also contemplated by the present invention. The dielectric layer 12 can be oxide material deposited using any conventionally known deposition method, such as, for example, chemical vapor deposition (CVD).

Figure 1:
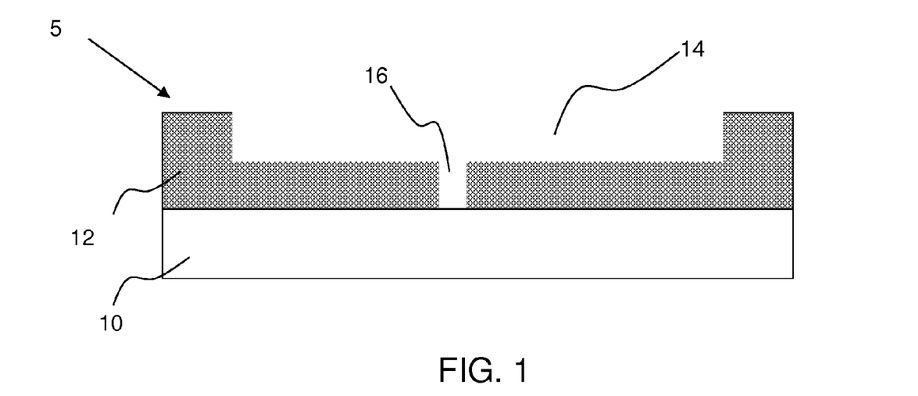
FIGS. 1-5 show fabrication processes and respective structures in accordance with aspects of the present invention.

In embodiments, a shallow trench 14 and a deep trench 16 are formed within the dielectric layer 12. The deep trench 16 is formed within the confines of the shallow trench 14, e.g., is aligned within the shallow trench 14. In embodiments, the shallow trench 14 and the deep trench 16 can be formed using separate conventional lithography and etching processes. For example, a resist can be formed on the dielectric layer 12, which is patterned by exposure to energy (light). A reactive ion etching (RIB) is performed through the pattern to form the shallow trench 14 within the dielectric layer 12. The resist can then be stripped or removed using conventional stripping processes, such as oxygen ashing processes. In a separate lithography and etching process, the deep trench 16 can then be formed, in a manner similar to that described with regard to the shallow trench 14. In embodiments, the shallow trench 14 can be about 50 nm in depth; whereas, in embodiments, the deep trench 16 can be about 50 nm in depth and about 50 nm in width. It should be understood by those of ordinary skill in the art that other dimensions are also contemplated by the present invention, depending on the thickness of the dielectric layer 12.

Figure 2:
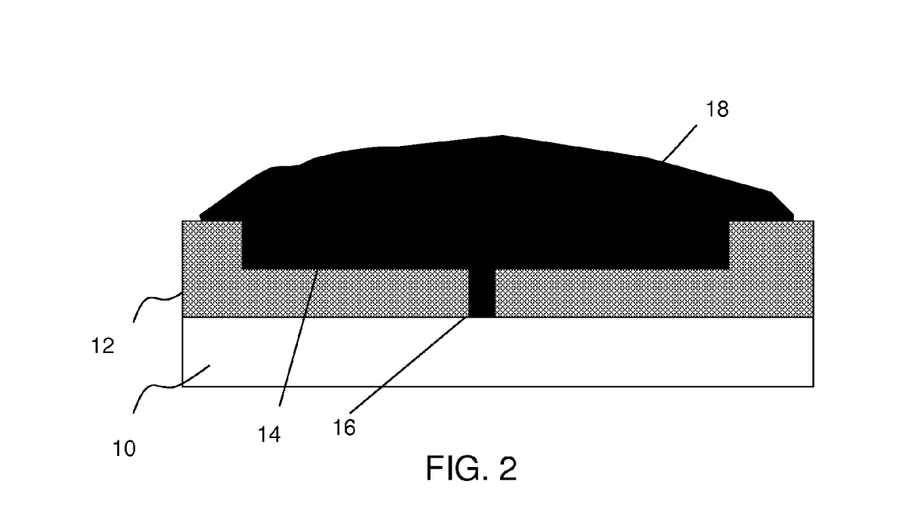

In FIG. 2, a lattice mismatch material 18 is formed within the shallow trench 14 and the deep trench 16. For example, in embodiments, the lattice mismatch material 18 can be formed by an epitaxial lateral overgrowth (ELO) process within the shallow trench 14 and the deep trench 16. The lattice mismatch material 18 can be any material that has a different lattice constant than the underlying substrate 10. For example, the lattice mismatch material 18 can be a III-V material, e.g., indium phosphide, indium gallium arsenide, gallium arsenide, etc. This may result in a defect within the deep trench 16, which will subsequently be removed. It should be understood that germanium and III-V materials can be used to improve performance in high-performance digital logic transistors in VLSI applications. That is, by using, for example, germanium and III-V materials there is significant potential for enhanced performance of both p- and n-channel FETs.

Figure 3:
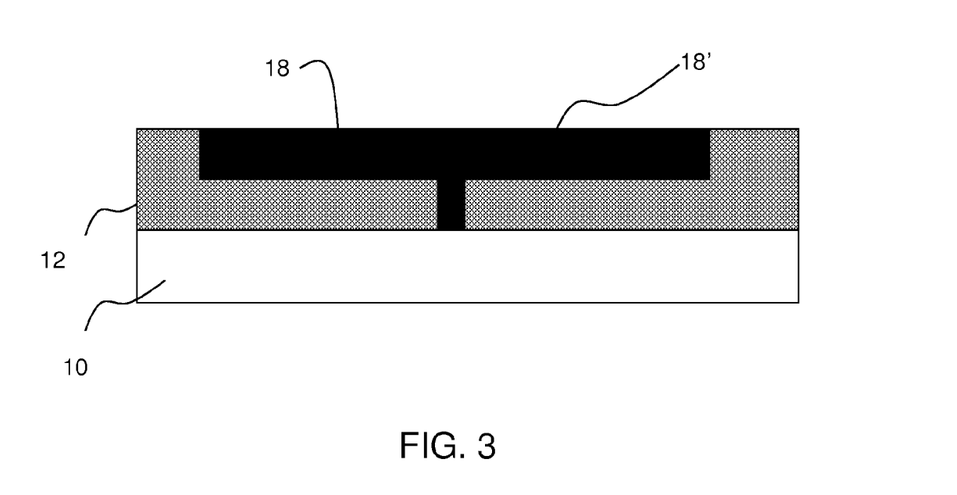

In FIG. 3, the lattice mismatch material 18 undergoes a planarization process. For example, the lattice mismatch material 18 can be planarized using a chemical mechanical planarization (CMP) process to planarize the lattice mismatch material 18 to the surface of the dielectric layer 12. In this way, the lattice mismatch material 18 will be planar within the shallow trench 14 (as shown by reference numeral 18').

Figure 4:
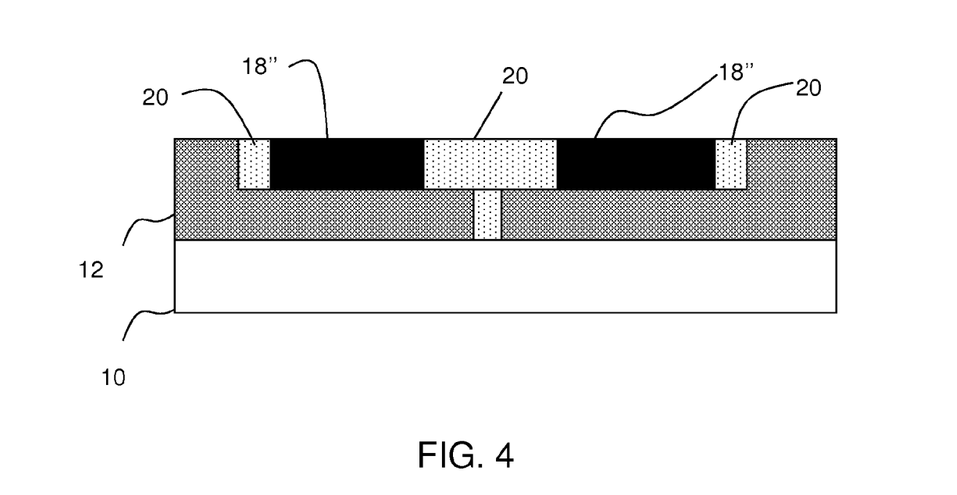

In FIG. 4, shallow trench isolation (STI) structures 20 are formed within the lattice mismatch material 18, and extending into the deep trench 16 (which is below an active area). It should be understood by those of skill in the art that the STI structures can be slightly recessed. In embodiments, the STI structures 20 can be formed using any insulator material, e.g., oxide. The STI structures 20 can be formed using conventional lithography and etching processes, e.g., RIE.

By way of example, a resist can be formed on the surface 18' of the lattice mismatch material 18, which is patterned by exposure to energy (light). A RIE is performed through the pattern to form trenches within the lattice mismatch material 18. In embodiments, the trenches are aligned with and formed within the deep trenches 16. The RIE process will remove any defects within the deep trench 16, e.g., by removing the material within the deep trench 16. The resist can then be stripped or removed using conventional stripping processes, such as oxygen ashing processes. An oxide material can then be deposited within the trenches (including within the deep trenches 16) to form the STI structures 20. In embodiments, any excess oxide material can be removed from the surface 18' of the lattice mismatch material 18 using, for example, CMP processes. In this way, active areas 18" are formed between the STI structures 20.

Figure 5:
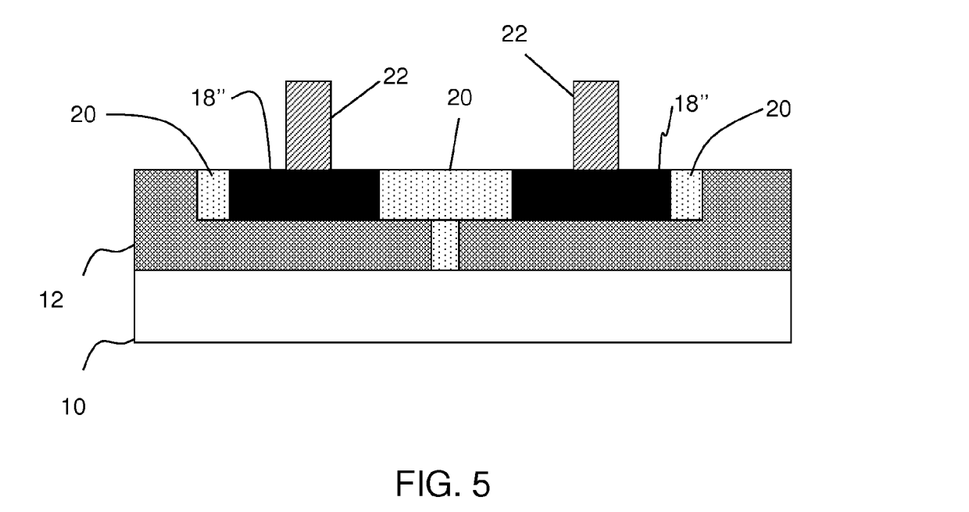

In FIG. 5, structures 22 can be fabricated on the active areas 18". These structures 22 can be, for example, NFETS and/or PFETS, fabricated using conventional deposition, lithography and etching steps, known to those of skill in the art. For example, the NFETS and/or PFETS can be fabricated by depositing a high-k dielectric material and metal or poly material on the active areas 18", e.g., using CVD or other deposition processes. The high-k dielectric material and metal or poly material can then be patterned using conventional lithography and etching processes as already described herein. Spacers and sidewalls can then be formed on the patterned materials, e.g., by deposition of nitride or oxide material. Source and drain regions can be formed using conventional implantation and/or doping processes, as is known to those of skill in the art.

FIGS. 6-11 show fabrication processes and respective structures in accordance with additional aspects of the present invention. In particular, the structure 5' of FIG. 6 includes a substrate 10. The substrate 10 can be, for example, a Si wafer; although other semiconductor materials are contemplated by the present invention, e.g., a P—Si wafer. A dielectric layer 12 can be deposited on the substrate 10, with thickness of about 100 nm; although other dimensions are also contemplated by the present invention. The dielectric layer 12 can be oxide material deposited using any conventionally known deposition method, such as, for example, CVD.

Figure 6:
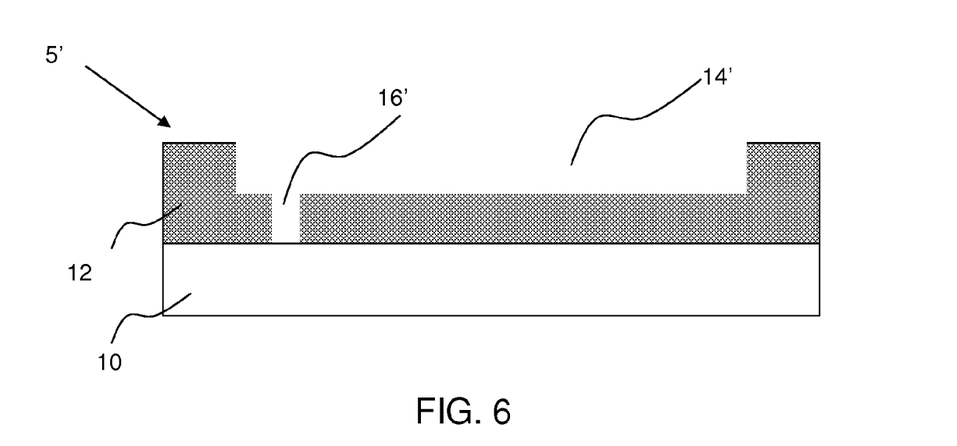
FIGS. 6-11 show fabrication processes and respective structures in accordance with additional aspects of the present invention.

In embodiments, a shallow trench 14' and a deep trench 16' are formed within the dielectric layer 12. The deep trench 16' is formed within the confines of the shallow trench 14, e.g., is aligned within the shallow trench 14'. In embodiments, the shallow trench 14' and the deep trench 16' can be formed using conventional lithography and etching processes as already described herein. In this embodiment, the deep trench 16' can be formed asymmetrically, e.g., on a single side of the structure. For example, the deep trench 16' can be formed on either a PFET or NFET side of the structure 5'. In embodiments, the shallow trench 14' can be about 50 nm in depth; whereas, in embodiments, the deep trench 16' can be about 50 nm in depth and about 50 nm in width. It should be understood by those of ordinary skill in the art that other dimensions are also contemplated by the present invention, depending on the thickness of the dielectric layer 12.

Figure 7:
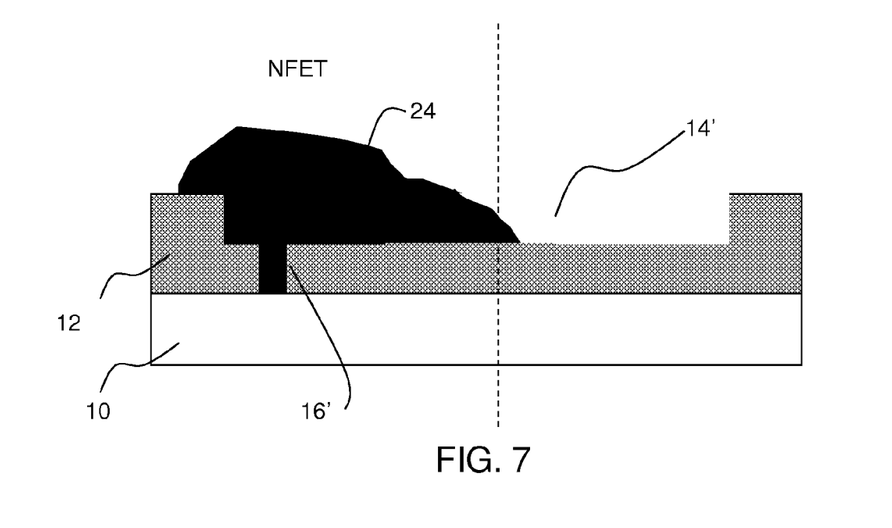

In FIG. 7, a layer of epitaxial material 24 is formed within the deep trench 16' and a portion of the shallow trench 14'. For example, in embodiments, the layer of epitaxial material 24 can be grown within the portion of the shallow trench 14' and the deep trench 16'. That is, the layer of epitaxial material 24 can be formed by an epitaxial lateral overgrowth (ELO) process within the shallow trench 14' and the deep trench 16'. The layer of epitaxial material 24 can be a III-V material, e.g., indium phosphide, indium gallium arsenide, gallium arsenide, etc. Preferably, the III-V material is grown on an NFET side of the structure.

Figure 8:
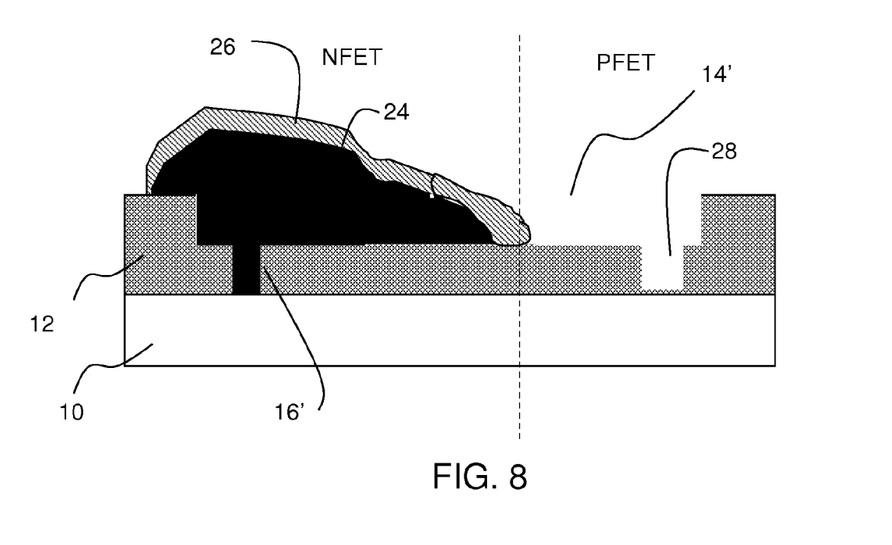

In FIG. 8, a hardmask material 26 is formed over the layer of epitaxial material 24. A deep trench 28 is then formed on the PFET side of the structure, using conventional lithography and etching processes. As should be understood by those of skill in the art, the hardmask material 26 will protect the underlying layer of epitaxial material 24 during subsequent etching processes.

Figure 9:
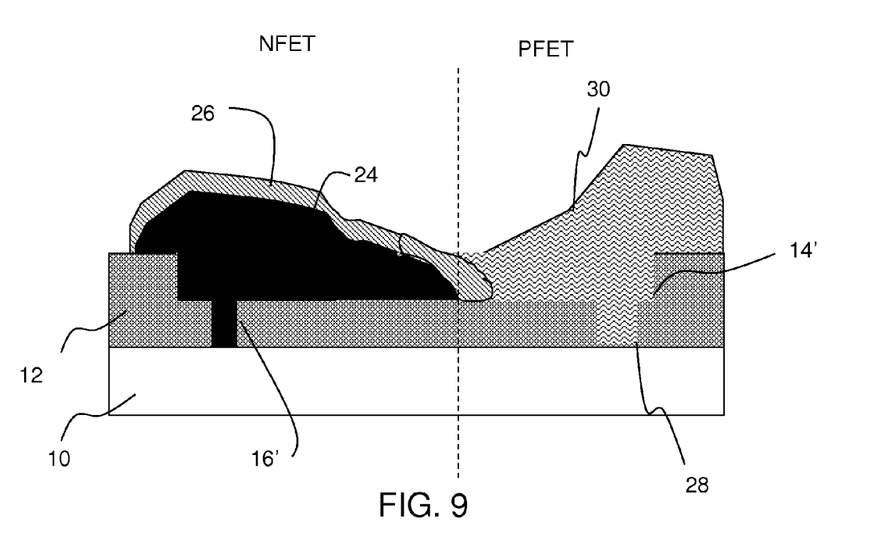

As shown in FIG. 9, a material 30 is formed within the remain portion of the shallow trench 14' and the previously formed deep trench 28. In embodiments, the material 30 is a different material than the epitaxial material 24, and is preferably a material 30 that has a different lattice mismatch material than the underlying substrate 10. For a PFET device, for example, the material 30 is germanium, which is formed in a growth process.

Figure 10:
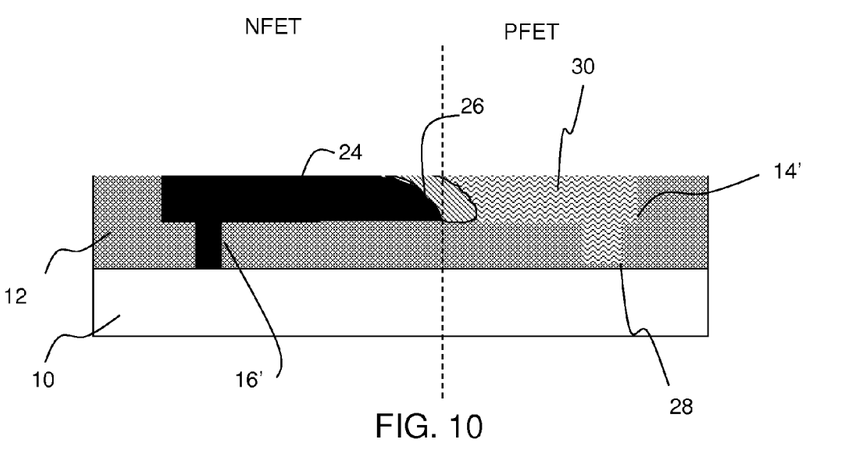

In FIG. 10, a planarization process is performed on the hardmask material 26, epitaxial material 24 and material 30. For example, the hardmask material 26, epitaxial material 24 and material 30 can be planarized using a CMP process to planarize the hardmask material 26, epitaxial material 24 and material 30 to the surface of the dielectric layer 12. In this way, the hardmask material 26, epitaxial material 24 and material 30 will be planar within the shallow trench 14'.

Figure 11:
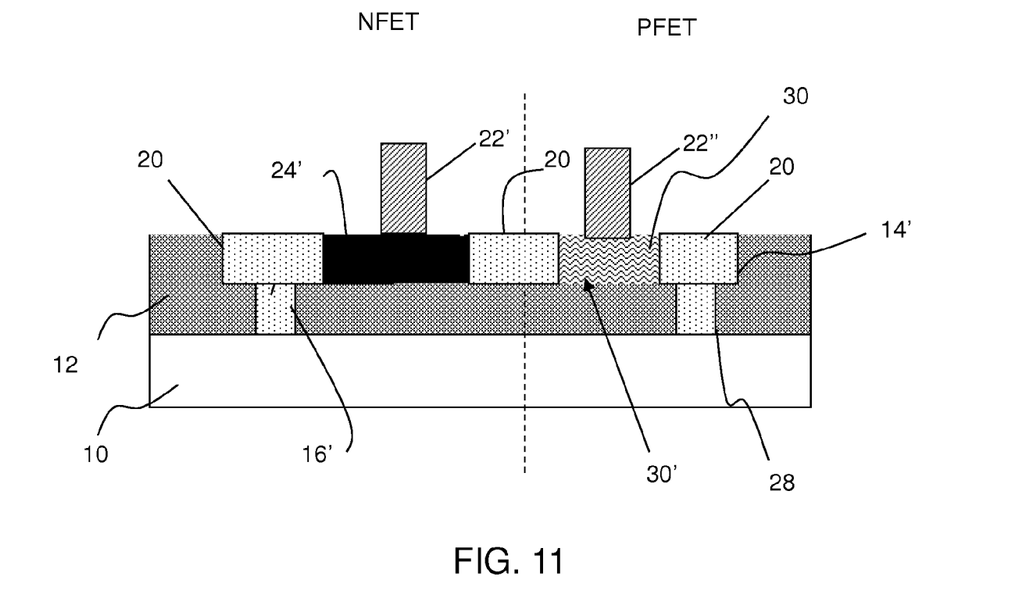

In FIG. 11, shallow trench isolation (STI) structures 20 are formed within the epitaxial material 24 and material 30, and extending into the deep trench 16' and deep trench 28. In embodiments, the STI structures 20 can be formed using any insulator material, e.g., oxide. The STI structures 20 can be formed using conventional lithography, etching, e.g., RIB, and deposition processes, as already discussed herein. In embodiments, any excess oxide material can be removed from the planarized surface of the epitaxial material 24 and material 30 using, for example, CMP processes. In this way, active areas 24' and 30' are formed between the STI structures 20. In embodiments, the active area 24' is an NFET active area and the active area 30' is a PFET active area.

Still referring to FIG. 11, structures 22' and 22" can be fabricated on the active areas 24' and 30', respectively. These structures 22' and 22" can be, for example, NFETS and/or PFETS, respectively, fabricated using conventional deposition, lithography and etching steps, known to those of skill in the art. For example, the NFETS and/or PFETS can be fabricated by depositing a high-k dielectric material and metal or poly material on the active areas 24' and 30'. The high-k dielectric material and metal or poly material can then be patterned using conventional lithography and etching processes as already described herein. Spacers and sidewalls can then be formed on the patterned materials, e.g., by deposition of nitride or oxide material. Source and drain regions can be formed using conventional implantation and/or doping processes, as is known to those of skill in the art.

Figure 12:
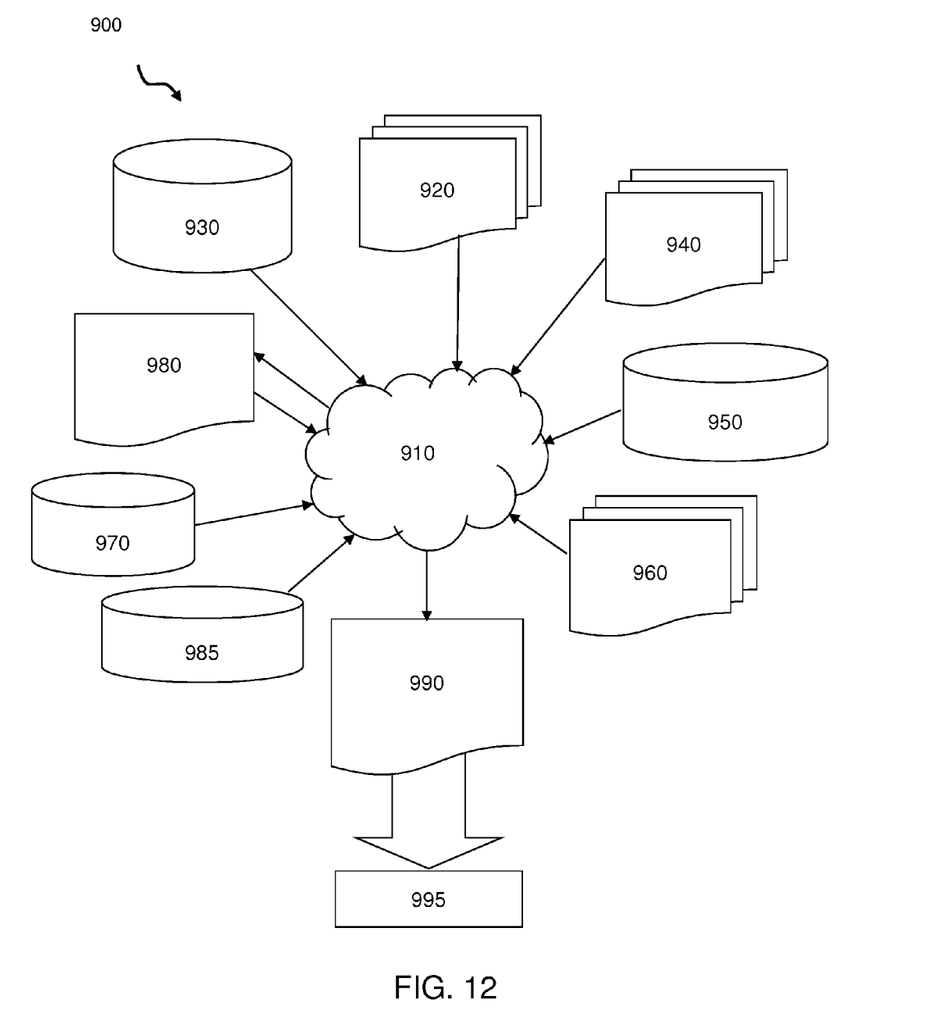
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a dielectric material on a substrate;
   forming a shallow trench structure and deep trench structure within the dielectric material;
   forming a material within the shallow trench structure and deep trench structure; and
   forming active areas of the material separated by shallow trench isolation structures, the shallow trench isolation structures being formed by:
      removing the material from within the deep trench structure and portions of the shallow trench structure to form trenches; and
      depositing an insulator material within the trenches.

2. The method of claim 1, wherein the material is lattice mismatch material in relation to the substrate.

3. The method of claim 2, wherein the lattice mismatch material is formed by an epitaxial lateral overgrowth (ELO) process within the shallow trench structure and the deep trench structure.

4. The method of claim 3, wherein the lattice mismatch material is a III-V material.

5. The method of claim 1, wherein the forming of the shallow trench isolation structures comprises:
   removing the material from within the deep trench structure and portions of the shallow trench structure by lithography and etching processes to form trenches; and
   planarizing the insulator material which was deposited within the trenches.

6. The method of claim 1, further comprising forming devices on the active areas.

7. The method of claim 1, wherein the deep trench structure is formed asymmetrically within the dielectric material on a NFET side of the shallow trench structure.

8. The method of claim 7, wherein the material is a layer of epitaxial material formed within a portion of the shallow trench structure and within the deep trench structure.

9. The method of claim 8, wherein the layer of epitaxial material is a III-V material formed by an epitaxial lateral overgrowth (ELO) process.

10. The method of claim 8, further comprising:
    forming a hardmask material over the layer of epitaxial material;
    forming a deep trench structure on a PFET side, adjacent to the NFET side;
    filling the deep trench structure and remaining portions of the shallow trench structure on the PFET side with another material, different than the layer of epitaxial material; and
    planarizing the material and the another material.

11. The method of claim 10, wherein the another material has a different lattice constant than the substrate.

12. The method of claim 11, wherein the another material is germanium formed using a growth process.

13. The method of claim 12, wherein the shallow trench isolation structures are formed within the deep trench structure on the PFET side and the deep trench structure on the NFET side and the active areas are a NFET active area and a PFET active area, separated by one of the shallow trench isolation structures.

14. A method, comprising:
forming a shallow trench structure within a dielectric material;
forming at least one deep trench structure within the dielectric material and aligned within the shallow trench structure;
forming at least a first material within the shallow trench structure and the deep trench structure;
forming active areas of the at least first material, comprising:
forming shallow trench isolation structures in the at least first material, wherein at least one of the shallow trench isolation structures extend within the deep trench structure after removal of the at least first material.

15. The method of claim 14, wherein the at least first material is lattice mismatch material in relation to an underlying substrate.

16. The method of claim 15, wherein the lattice mismatch material is formed by an epitaxial lateral overgrowth (ELO) process within the shallow trench structure and the deep trench structure.

17. The method of claim 14, wherein:
the deep trench structure is formed asymmetrically within dielectric material on a NFET side of the shallow trench structure;
the at least first material is a layer of epitaxial material formed within a portion of the shallow trench structure and within the deep trench structure; and
the layer of epitaxial material is a III-V material formed by an epitaxial lateral overgrowth (ELO) process.

18. The method of claim 17, further comprising:
forming a hardmask material over the layer of epitaxial material;
forming a deep trench structure on a PFET side;
filling the deep trench structure on the PFET side and remaining portions of the shallow trench structure on the PFET side with germanium formed by a growth process;
planarizing the germanium and the layer of epitaxial material; and
separating the germanium of the PFET side and the layer of epitaxial material of the NFET side with one of the shallow trench isolation structures.

* * * * *